US009728371B2

(12) United States Patent
Glavish et al.

(10) Patent No.: US 9,728,371 B2
(45) Date of Patent: Aug. 8, 2017

(54) ION BEAM SCANNER FOR AN ION IMPLANTER

(71) Applicant: Nissin Ion Equipment Co., Ltd., Kyoto-Shi, Kyoto (JP)

(72) Inventors: Hilton Frank Glavish, Incline Village, NV (US); Masao Naito, Kyoto (JP); Benjamin Thomas King, Lower Hutt (NZ)

(73) Assignee: NISSIN ION EQUIPMENT CO., LTD., Kyoto (JP)

( * ) Notice: Subject to any disclaimer, the term of this patent is extended or adjusted under 35 U.S.C. 154(b) by 0 days.

(21) Appl. No.: 14/722,253

(22) Filed: May 27, 2015

(65) Prior Publication Data
US 2016/0351372 A1   Dec. 1, 2016

(51) Int. Cl.
*H01J 37/00* (2006.01)
*H01J 37/147* (2006.01)
*H01J 37/317* (2006.01)
*H01J 37/14* (2006.01)

(52) U.S. Cl.
CPC .......... *H01J 37/1475* (2013.01); *H01J 37/14* (2013.01); *H01J 37/3171* (2013.01); *H01J 2237/057* (2013.01)

(58) Field of Classification Search
CPC .... H01J 37/14; H01J 37/1475; H01J 37/3171; H01J 2237/057
USPC .............................. 250/396 R, 398, 396 ML
See application file for complete search history.

(56) References Cited

U.S. PATENT DOCUMENTS

| 5,438,203 | A | 8/1995 | Glavish et al. |
| 5,481,116 | A | 1/1996 | Glavish et al. |
| 5,672,879 | A | * | 9/1997 | Glavish ............... H01J 37/1475 250/396 ML |
| 7,635,850 | B2 | 12/2009 | Yamashita et al. |
| 7,807,986 | B1 | 10/2010 | Jen et al. |
| 8,334,517 | B2 | 12/2012 | Jen et al. |

OTHER PUBLICATIONS

Anferov, Vladimir, Combined X-Y Scanning Magnet for Conformal Proton Radiation Therapy, Indiana University Cyclotron Facility, Bloomington, Indiana 47408, Mar. 2, 2005, 4 pages.

* cited by examiner

*Primary Examiner* — Wyatt Stoffa
*Assistant Examiner* — Hanway Chang
(74) *Attorney, Agent, or Firm* — Haynes and Boone LLP

(57) ABSTRACT

A magnetic system for uniformly scanning an ion beam across a semiconductor wafer comprises a magnetic scanner having ac and dc coil windings each of which extend linearly along internal pole faces of a magnetic core. The ac and dc coil windings are mutually orthogonal; a time dependent magnetic component causes ion beam scanning while a substantially static (dc) field component allows the ion beam to be bent in an orthogonal plane. The current density in the ac and dc coil windings is uniformly dispersed along the pole faces leading to an improved beam spot uniformity at the wafer. The magnetic system also includes a collimator having first and second mutually opposed symmetrical dipoles defining an aperture between them. The poles of each dipole have a pole face varying monotonically and polynomially in a direction perpendicular to a central axis of the collimator: an increasing pole gap is formed towards that central axis.

21 Claims, 15 Drawing Sheets

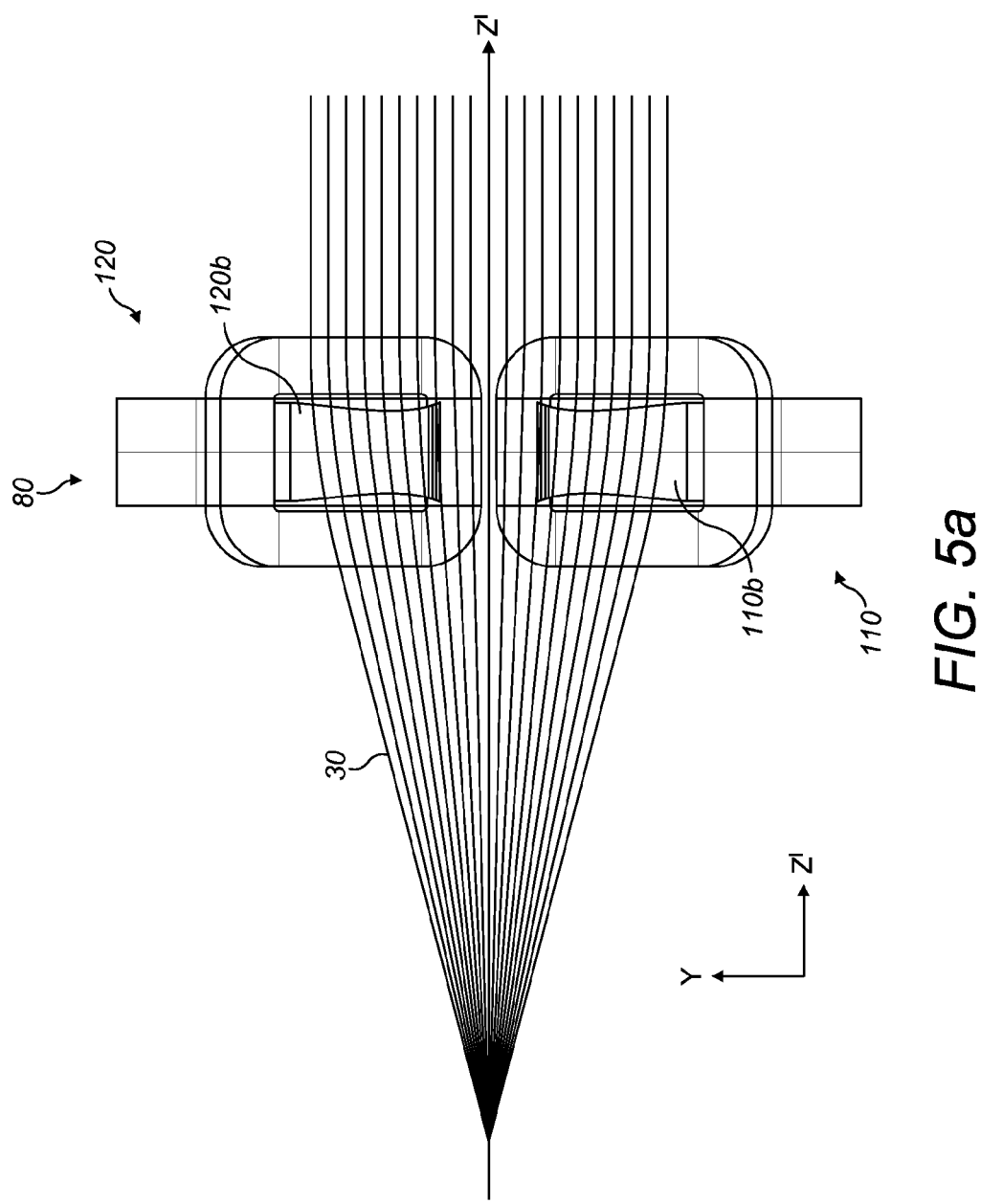

ION BEAM SCANNER FOR AN ION IMPLANTER

BACKGROUND

Field of the Invention

This invention relates to magnetic systems such as ion implanters that scan ion beams of atoms and molecules comprised of light and heavy elements, and in particular to an ion beam scanner for such an ion implanter.

Background of the Invention

There are numerous industrial and scientific applications that require surfaces to be uniformly irradiated by ion beams. For example, modification of semiconductors such as silicon wafers is often implemented by irradiating the wafer with a beam of specific ions or molecules of a specific energy. Because the physical size of the wafer or substrate (e.g., about 200 mm-300 mm in diameter or more) is larger than the cross-sectional area of the irradiating beam (e.g., about 50 mm in diameter or less), the required uniform irradiance is commonly achieved by scanning the beam across the wafer or scanning the wafer through the beam, or a combination of these techniques.

It is distinctly advantageous to have a high beam scan rate over the substrate for a number of reasons: the irradiance uniformity is more immune to changes in the ion beam flux; a higher wafer throughput is possible at low dose levels; and for high dose applications degradation from local surface charging, thermal pulsing, and local particle-induced phenomena such as sputtering and radiation damage are greatly reduced.

Scanning techniques based only upon reciprocating mechanical motion are very limited in speed. Motion of the wafer on an arc through the beam greatly improves the scan speed but requires many wafers or substrates to be simultaneously mounted on a rotating carousel in order to obtain efficient utilization of the beam.

In a common variation, a time varying electric field is used to scan the beam back and forth in one direction, while the wafer is reciprocated in another direction. In this hybrid type of implanter the beam current and hence rate at which wafers can be processed is severely limited by the space-charge forces which act in the region of the time-varying deflecting electric fields. These forces cause the ions in the beam to diverge outward, producing an unmanageably large beam envelope. Such a space-charge limitation also occurs in implanters that use time-varying electric fields to scan the beam in two directions. Also, electric field scanning becomes more difficult to implement at high ion energies because of the large electric fields required.

As a result, magnetic scanning techniques have been developed and are used extensively in the manufacture of semiconductor devices and also for exfoliating thin films of substrates such as silicon, sapphire and silicon carbide. In ion implanters employing magnetic scanning techniques, ions enter a scanning magnet in a beam from an ion source. The beam exits the scanning magnet as a divergent fan beam. This fan beam is then formed into a (more or less) parallel ribbon using a collimator magnet downstream of the scanning magnet, such as is described in U.S. Pat. No. 5,438,203 and U.S. Pat. No. 5,311,028. The resultant ribbon beam is then directed toward a wafer or other target substrate to be implanted, where it arrives at the surface of the target along a constant preselected direction irrespective of the position of the beam on the target substrate.

An early example of a scanning magnet for ion implantation is described in U.S. Pat. No. 5,311,028. The arrangement described therein employs a scanning magnet that permits the scanning of high perveance, heavy ion beams at frequencies of up to 1 kHz.

One of the problems of scanning magnets is that the electron gyro radius r of neutralizing electrons in the ion beam increases as the magnetic field strength B of the scanning magnet decreases. As the magnetic field strength approaches zero, electron orbits describe an outward spiraling envelope, thus reducing the electron density in the region of the ion beam. The consequence of this is that the space charge neutralization in the beam changes as the scanning magnetic field used to scan the ion beam passes through or approaches zero. This generally results in a beam size fluctuation during the zero field crossing leading in turn to a degraded uniformity of irradiation of the wafer.

In the aforementioned U.S. Pat. No. 5,438,203, a solution to the problem of beam size fluctuation during zero field crossing is proposed. A magnetic deflection system is described with a magnetic scanning structure. The magnetic scanning structure has laminated poles separated by insulating layers, and ac coils which are energized by a scanning current source. In use, an excitation current is applied to the ac coils which results in a unipolar scanning magnetic field above a predetermined value, in the gap between the pole faces. That predetermined value is sufficiently greater than zero that the B field does not approach a zero field crossing. In that manner, the beam size does not fluctuate at the wafer or substrate.

Nevertheless, the solution to the problem of non-uniform implantation due to zero field crossing, as proposed in the above mentioned U.S. Pat. No. 5,438,203, places increased demands on the power consumed by the ion implanter, because the reactive power of a unipolar scanning magnetic field as disclosed therein, is significantly greater than the reactive power of a bipolar scanning magnetic field. Such issues are exacerbated as commercial endeavors to increase the diameter of the wafers to be implanted up to 450 mm or more are undertaken. There is also a desire to reduce the capital cost of an ion implanter.

U.S. Pat. No. 5,481,116 also addresses the problem of zero field crossing beam size fluctuation. Here, a scanner magnet is formed of a magnetic structure with poles having faces to form a gap through which the ion beam passes. Ac coils are associated with the poles. A current is applied to the ac coils to produce a bipolar scanning field. Dc current carrying coils are disposed adjacent the gap and produce a dc magnetic field component which is orthogonal to the bipolar (ac) magnetic field component in the gap. The interaction of the ion beam with the ac and dc magnetic fields means that the beam never experiences a zero field crossing and hence the beam emittance remains stable.

In addressing the zero field crossing problem, the arrangement of U.S. Pat. No. 5,481,116 thus does not suffer from the increased reactive power issues of U.S. Pat. No. 5,438,203. It does however suffer from different drawbacks. The arrangement of U.S. Pat. No. 5,481,116 uses a well-defined pole boundary within the gap through which the ion beam passes. Both the ac coils and the dc coils have a bobbin type construction. This results in a relatively non uniform dc magnetic field which causes variations in the transverse deflection of the ion beam. The consequence of this is that there is an ion optical deterioration of the beam size at the downstream wafer to be implanted.

The above referenced U.S. Pat. No. 5,438,203 proposes a sector collimator magnet with pole edge contours that are fourth order polynomials. Using terms up to fourth order permits an increased deflection of ions, to reduce the number of neutral molecules arriving at the wafer to be implanted, whilst the beam control requirements (parallelization, dimensional and angular constraints, etc.) continue to be met.

BRIEF SUMMARY OF THE INVENTION

Set against this background, one aspect of the present invention provides a magnetic deflection system for scanning an ion beam over a selected surface, comprising a magnetic core having first and second core end faces and a channel extending through the magnetic core between the first and second core end faces; ac coils having ac coil windings extending through the channel in the magnetic core; dc coils having dc coil windings also extending through the channel in the magnetic core, said dc coils being substantially free from inductive coupling with said ac coils; the ac coils and dc coils defining therebetween a gap through which the ion beam passes; an ac current source, coupled to said ac coils and adapted to apply to said ac coils an excitation current to generate an ac magnetic field component in said gap that substantially alternates in polarity as a function of time, to cause scanning of the ion beam; and a dc current source coupled to said dc coils, and adapted to apply to said dc coils a current that generates a dc magnetic field component in the gap; wherein the ac coil windings extend in a longitudinal direction of the channel across the first and second core end faces and are substantially unidirectional between the first and second core end faces; wherein the dc coil windings further extend in a longitudinal direction of the channel across the first and second core end faces and are substantially unidirectional between the first and second core end faces.

The ac coil windings may each be parallel with one another through the channel but may be formed outside of the channel in non-parallel directions; and further the dc coil windings may be each parallel with one another through the channel but in a different plane or planes to that or those in which the ac coil windings lie, the dc coil windings being formed outside of the channel in non-parallel directions.

The ac coil windings may optionally extend in a direction generally orthogonal with the direction of the ac magnetic field component along substantially the whole of the length of the magnetic core between the first and second core end faces.

Aspects of the invention thus provide a magnetic scanner with ac windings that may be energized so as to create an ac magnetic field component that scans the ions in a first direction, for example across the surface of a semiconductor wafer. In contrast with the prior art, however, the ac windings do not have a racetrack or bobbin configuration but instead extend in a direction which is parallel with—or at least, does not intersect—the longitudinal axis of the ion beam as it passes through the magnetic scanner, all the way between the front and end pole faces of the core. Such an arrangement results in a current density along the pole faces which is substantially uniformly or linearly dispersed, rather than being concentrated in a part of the pole face. This in turn provides for an improved uniformity to the ac magnetic field experienced by the ions as they are deflected, which improves the uniformity of the beam spot characteristics downstream at a target substrate.

The dc windings of the magnetic scanner may likewise be energized so as to create a dc magnetic field component that deflects or bends ions in a second direction orthogonal with the first scanning direction. Such bending in a plane perpendicular to the scanning direction permits the central longitudinal axis of the ion beam as it arrives at the magnetic scanner to differ from the central longitudinal axis of the ion beam as it arrives at the target substrate—in other words, there is no line of sight between the entrance to the magnetic scanner and the target substrate. This in turn permits neutral molecules (whose direction of travel is of course unaffected by the presence of the magnetic fields within the magnetic scanner) to be separated from the ion beam at positions downstream of the magnetic scanner.

The invention also extends to an ion implantation system comprising: an ion source for generating an ion beam including a selected species of ions; a magnetic deflection system as herein defined, positioned downstream of the said ion source, for scanning the said ion beam over a selected surface; an end station arranged to position a semiconductor substrate having a selected surface for receiving said ion beam; and a vacuum housing extending from said ion source, about said magnetic deflection system to said end station, so that said ion beam travels under vacuum from said ion source, via said magnetic deflection system to said end station; wherein the ac coils, when energized by the ac current source, scan the ion beam in a first direction in the plane of the said selected surface, and further wherein the dc coils, when energized by the dc current source, cause the ion beam to deviate in a plane perpendicular to the first direction in which the ion beam scans.

In that case, the magnetic deflection system may optionally define a central longitudinal axis between an entrance and an exit of the said magnetic deflection system, and wherein the dc coils, when energized, cause ions in the ion beam lying to a first side of the central longitudinal axis in the said plane perpendicular to the said first direction, to converge towards, and cross, the said central longitudinal axis, but cause ions in the ion beam lying to a second, opposed side of the central longitudinal axis in the said plane perpendicular to the said first direction, to diverge away from the said central longitudinal axis.

Optionally, the ion implantation system may include an ion beam compensator located downstream of the said magnetic deflection system and configured to collimate the scanned ion beam in a direction generally orthogonal both to the direction of travel of the ion beam and also to the direction in which the ion beam is scanned.

Additionally or alternatively, the ion implantation system may further comprise an ion beam collimator having first and second mutually opposed, symmetrical dipoles, defining there between an ion beam aperture having a central axis extending through it in a direction parallel with a central ion beam trajectory, each pole of the said first and second dipoles having a pole face varying monotonically and polynomially in a direction perpendicular to the said central axis, so as to form an increasing pole gap towards the said central axis.

In that case, each pole face of the ion beam collimator may have a generally hyperbolic contour, so as to create a quadrupole field within the ion beam region near the central axis of the beam.

Further, the width of the first and second dipoles of the ion beam collimator, in a direction parallel with the central axis, may increase with distance in a direction perpendicular to the said central axis, so that ions arriving at the ion beam collimator at positions relatively distal from the central axis in a direction perpendicular thereto have a longer path length through the collimator than ions arriving at the collimator at positions relatively close to the central axis in the said perpendicular direction, so that ions arriving at the collimator in a fan shaped beam are caused to exit the said collimator as a substantially parallel beam with an axis parallel with the central axis of the collimator.

The poles of the collimator may be truncated at a position of minimum separation between the pole faces in each of the first and second dipoles, in a direction perpendicular to the said central axis of the ion beam aperture.

The specific pole shape of the ion beam collimator permits incident ions travelling in initially divergent directions away from a central longitudinal axis to be deflected in opposite directions back towards that central longitudinal axis, so as to result in a parallel ion beam downstream of the magnetic scanner. In particular, the transverse working gap between the dipoles at the extremities of the ion beam (where deflection of ions is greatest) is narrower than the transverse working gap between the dipoles towards the central longitudinal axis of the ion beam, where ions experience a smaller angle of deflection. This in turn achieves a highly precise ion collimation with a minimum cost collimator structure.

According to still a further aspect of the present invention there is provided a method of scanning an ion beam over a selected surface, the method comprising the steps of (a) generating ions in an ion source; (b) generating, in a longitudinal channel of a magnetic scanner positioned downstream of the ion source: (i) an ac field, and (ii) a dc field, in a plane substantially orthogonal to that of the ac field; wherein the magnetic scanner has a magnetic core having first and second core end faces and a channel extending through the magnetic core between the first and second core end faces; ac coils having ac coil windings extending substantially unidirectionally through the channel in the magnetic core and across the first and second core end faces, the to generate ac field; dc coils having dc coil windings also extending substantially unidirectionally through the channel in the magnetic core and across the first and second core end faces to generate the dc field, said dc coils being substantially free from inductive coupling with said ac coils; the ac coils and dc coils defining therebetween the longitudinal channel; (c) directing the ions from the ion source into the longitudinal channel of the magnetic scanner so that they are caused by the ac field in the channel to scan across the selected surface positioned downstream of the magnetic scanner.

In accordance with yet another aspect of the present invention, there is provided a method of generating a parallel beam of ions in an ion implanter, comprising the steps of: (a) generating ions in an ion source; (b) deflecting the ion beam path in a magnetic scanner so as to form a generally fan shaped ion beam; (c) directing the fan shaped ion beam towards an ion beam collimator having an ion beam aperture with a central axis extending through it in a direction parallel with a central ion beam trajectory; (d) collimating the fan shaped beam of ions in the collimator, such that ions exit the collimator as a parallel beam in a direction generally parallel with the said central axis of the ion beam aperture; the said step (d) of collimating the fan shaped beam further comprising: (e) generating a magnetic field in the ion beam aperture of the collimator that varies monotonically and polynomially in a direction perpendicular to the said central axis, so that ions arriving at the collimator relatively close to the said central axis in a direction perpendicular thereto experience a weaker magnetic field strength than those ions relative distal from the said central axis in a direction perpendicular thereto.

BRIEF DESCRIPTION OF THE DRAWINGS

Embodiments of the invention will now be described by way of example only and with reference to the following figures in which:

FIG. 1b shows a more detailed perspective view of a part of the ion implantation system of FIG. 1a;

FIG. 2b shows a section through the perspective view of the magnetic scanner of FIG. 2a;

FIGS. 5a and 5b show, respectively, plan and perspective views of the collimator of FIGS. 1a and 1b, together with ion trajectories as they pass through the collimator;

DETAILED DESCRIPTION OF THE EMBODIMENTS

Figure 1A:
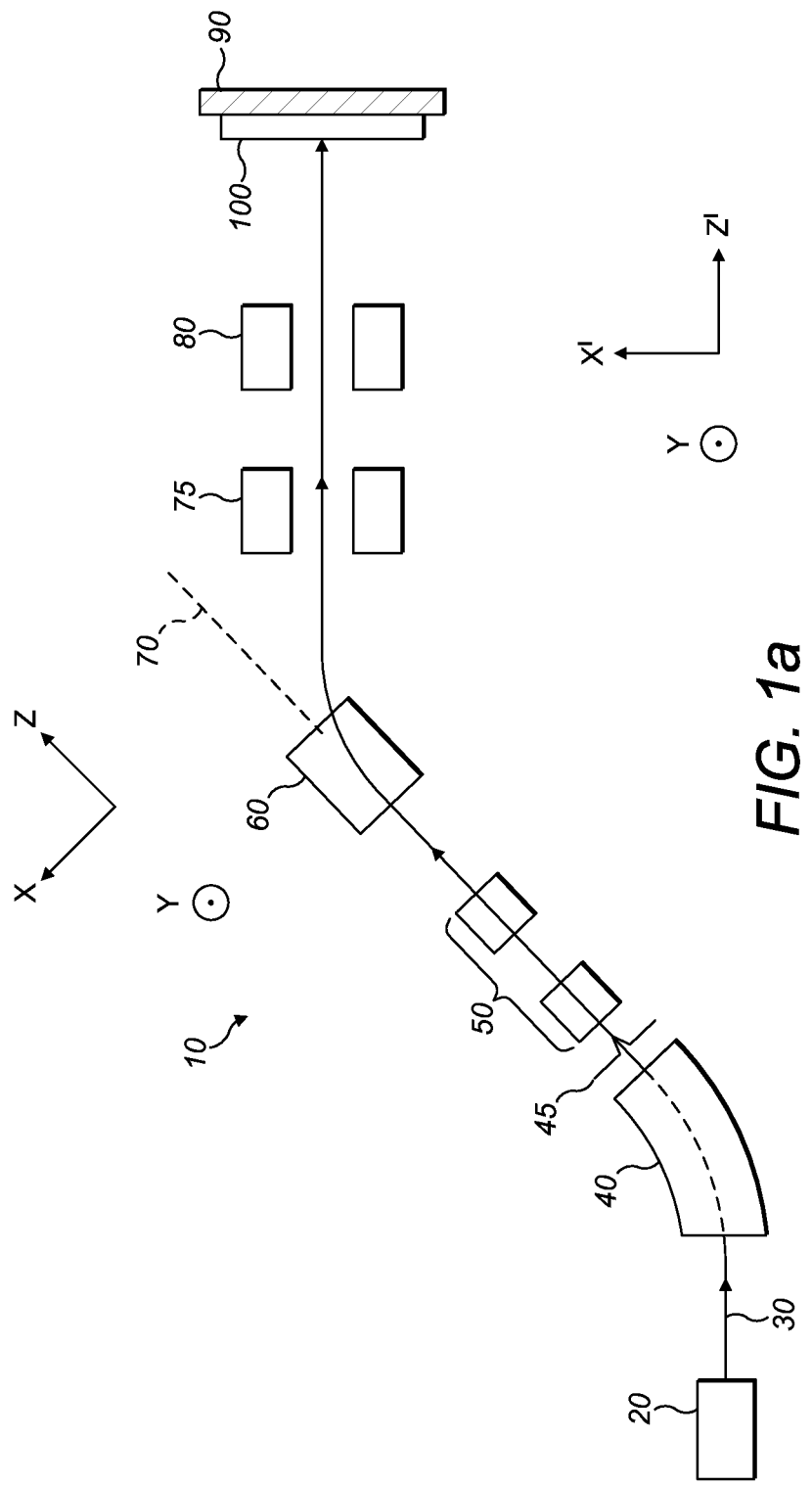
FIG. 1a shows a highly schematic plan view of an ion implantation system embodying an aspect of the present invention and including a magnetic scanner and a collimator.

Referring first to FIG. 1a, ion implanter 10 is shown in highly schematic plan view. In the ion implanter 10, an ion source 20 generates an ion beam 30 comprising or including heavy ions such as those derived from the elements of boron, nitrogen, oxygen, phosphorus, arsenic or antimony, for implantation, for example, into a semiconductor wafer 100. An adjustable power supply (not shown in FIG. 1) is used to accelerate the ion beam 30. As is explained, for example, in the above referenced U.S. Pat. No. 5,481,116, electrons become trapped or confined within the ion beam 30. Thus, the ion beam becomes nearly electrically neutral in the absence of external electric fields and insulating surfaces. Under such conditions, the ion beam can be transported through the ion implanter 10 under high vacuum, without exhibiting beam divergence from the action of repulsive space-charge forces.

A sector magnet 40 selects atomic or molecular species in accordance with the mass to charge ratio (m/q) of the incident ions, as will be well understood by those skilled in the art.

The resulting ion beam that exits the sector magnet 40 passes through a resolving slit 45 resulting in a generally ribbon-shaped ion beam. Further ion optical elements 50 may provide additional ion beam shaping and energy setting before the ion beam 30 arrives at the magnetic scanner 60. The magnetic scanner 60 will be described in further detail, in particular in FIGS. 2a, 2b, 3 and 4 below.

Figure 1B:
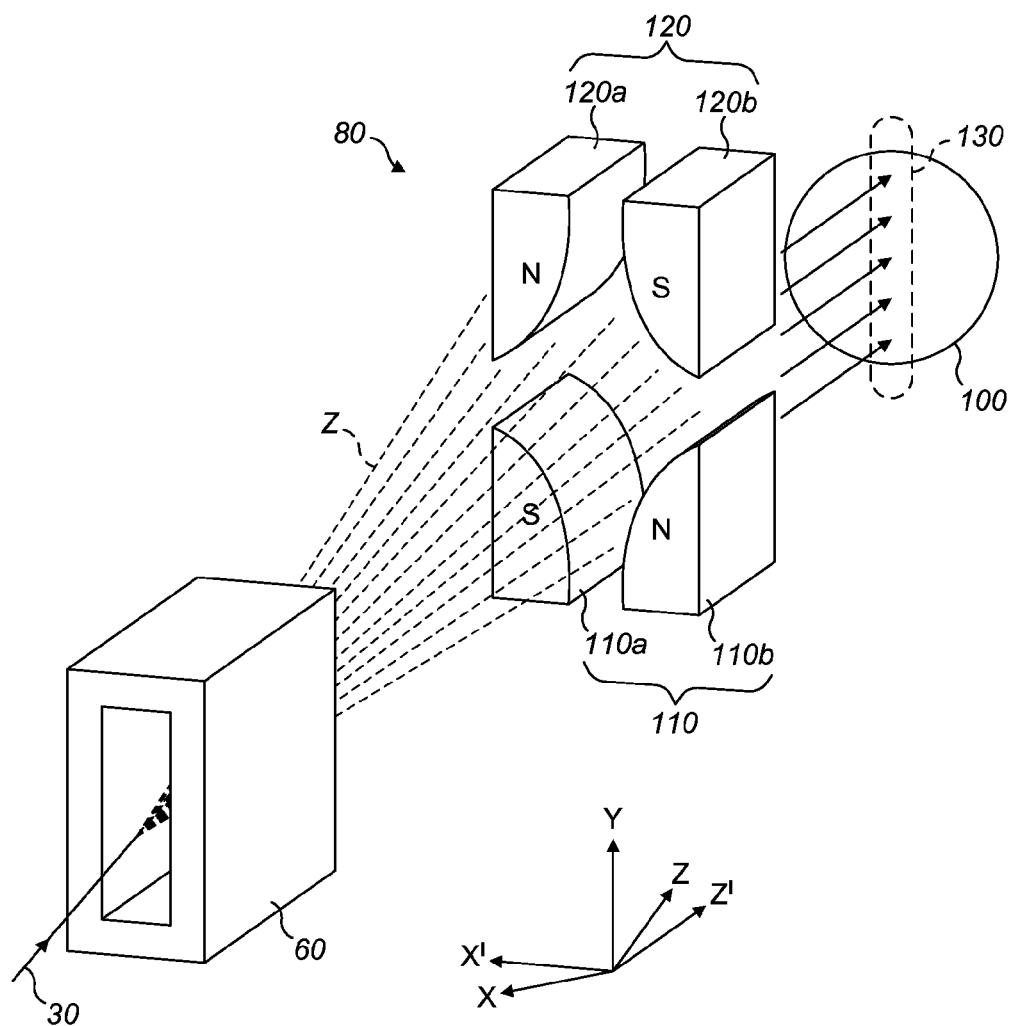

By way of introduction, however, the magnetic scanner 60 causes ions in the ion beam 30 to be scanned in a direction into and out of the plane of FIG. 1a (i.e. in the Y direction). This results in divergent, fan-shaped ion beam paths as viewed in the Y-Z direction as shown in FIG. 1b.

Still referring to FIG. 1a, the magnetic scanner 60 also causes ions in the ion beam 30 to bend in the X-Z plane, away from a central longitudinal axis Z of the magnetic scanner 60. Thus, in addition to scanning in the +/−Y direction, ions are caused to move in the X-Z plane. In particular, ions arriving at the magnetic scanner 60 on a first side of the central longitudinal axis Z are bent by the magnetic scanner 60 in the X-Z plane so that they cross that axis Z and diverge away from it. Ions arriving at the magnetic scanner 60 on a second, opposite side of the central longitudinal axis Z are bent by the magnetic scanner 60 in the same general direction in the X-Z plane so that they diverge away from the axis Z without ever crossing it.

Ions of a desired species thus follow a curved path in the X-Z plane so as to arrive at a compensator 75 which, again, will be described in further detail in connection with FIGS. 11a and 11b below. The compensator 75 is an optional component in the arrangement of FIG. 1a. The compensator 75 focuses the ion beam in the X' direction of FIG. 1a.

Downstream of the compensator 75 is a collimator 80 whose configuration and function will be described in further detail below in connection with several of the figures. In brief terms, however, the collimator 80 causes ions which are diverging in the Y-Z' plane as they arrive at the collimator 80, to be deflected so as to form, downstream of the collimator, a parallel, ribbon-shaped beam. The manipulation of the shape of the ion beam so as to generate a ribbon-shaped beam may be seen best in FIGS. 1b, 5a and 5b, for example.

The parallel, scanned ion beam exiting the collimator 80 arrives at a wafer holder 90 upon which is mounted a semiconductor wafer 100. As will be understood by those skilled in the art, the wafer holder 90 and semiconductor wafer are moved together in reciprocal fashion, in a +/−X' direction orthogonal to the +/−Y scanning direction of the ion beam, so as to uniformly implant ions of a desired species and energy into and over the entire surface of the semiconductor wafer 100.

Although the arrangement of FIGS. 1a and 1b shows a single semiconductor wafer 100 mounted for implantation of ions, it will be understood that this is merely illustrative and that, for example, a carousel or drum type wafer holder could instead be employed. Here, a plurality of wafer holders are distributed around the circumference of the carousel or drum which are rotated about an axis such as to pass the wafers in succession in approximately the X' direction through the ion beam which is scanning in the +/−Y direction.

As will also be understood by the skilled person, the ion implanter 10 of FIG. 1a is enclosed within a high vacuum chamber but this is not shown for the sake of clarity.

FIG. 1b shows, also in schematic form, a part of the ion implanter 10 of FIG. 1a in perspective view. In particular, FIG. 1b shows the magnetic scanner 60 and the incident ion beam 30. The central longitudinal axis Z of the magnetic scanner 60 is also indicated in FIG. 1b. The deflection in the −X direction of the ion beam paths passing through the magnetic scanner 60 can be discerned. In particular ions on both sides of the axis 70 are always deflected by the magnetic scanner 60 in the −X direction so that some cross the central longitudinal axis Z before diverging away from it, whereas others simply diverge away from that central longitudinal axis Z without ever crossing it. The bending of the ions in the X-Z plane result in a net direction of travel of ions along an axis Z' downstream of the scanner 60.

The optional compensator 75 is omitted in the perspective view of FIG. 1b, so that the relative positions of the magnetic scanner 60 and collimator 80 can more clearly be seen.

The collimator 80 comprises a pair of dipoles 110, 120, respectively containing magnetic pole elements 110a, 110b and 120a, 120b. The magnetic pole elements have a particular shape and orientation relative to the incident ion beam 30, to be described in further detail below. The semiconductor wafer 100 mounted upon the wafer holder 90 of FIG. 1a is also shown in FIG. 1b, although not to scale, for clarity reasons. The footprint of scanned ions upon the semiconductor wafer 100 is shown schematically as a dashed line 130 not accurately to scale.

Having described the main components of the ion implanter 10, the magnetic scanner 60 which embodies an aspect of the present invention will now be described. One such magnetic scanner 60 is illustrated in particular in FIGS. 2a and 2b.

The magnetic scanner 60 comprises a yoke or magnetic core 160 having first and second end faces 160a, 160b. The magnetic core 160 is generally a right rectangular prism having a rectangular section channel formed longitudinally through it. The channel has a central axis that defines the central longitudinal axis Z of the magnetic scanner 60.

Coil windings 140 extend along and are formed upon first and second opposed inner walls of the rectangular section channel in the magnetic core 60. In the following description, these coil windings 140 will be referred to as "ac coil windings". However, it is to be understood that any coils carrying a time varying current so as to provide a substantially/predominantly time varying magnetic field are contemplated. In the orientation shown in FIG. 2a, the ac coil windings 140 extend in parallel X-Z planes equidistantly spaced from the central longitudinal axis Z.

Coil windings 150 extend along and are formed upon third and fourth opposed inner walls of the rectangular section channel in the magnetic core 60. Again although in the following description, these coils will be referred to as "dc coil windings", it is to be understood that the field generated by the coils need only be predominantly or substantially time invariant. For example, in some embodiments, it may be desirable to add a small time varying perturbation to the dc current supplied to the coil windings 150, in order to introduce a "wobble" to the ion beam in a direction orthogonal to the longitudinal (Z) direction of the ion beam and also orthogonal to the scanning direction (+/−Y). Such a perturbation can assist with removal of ion density variations introduced into the ion beam by features of the ion source 20.

Figure 2A:
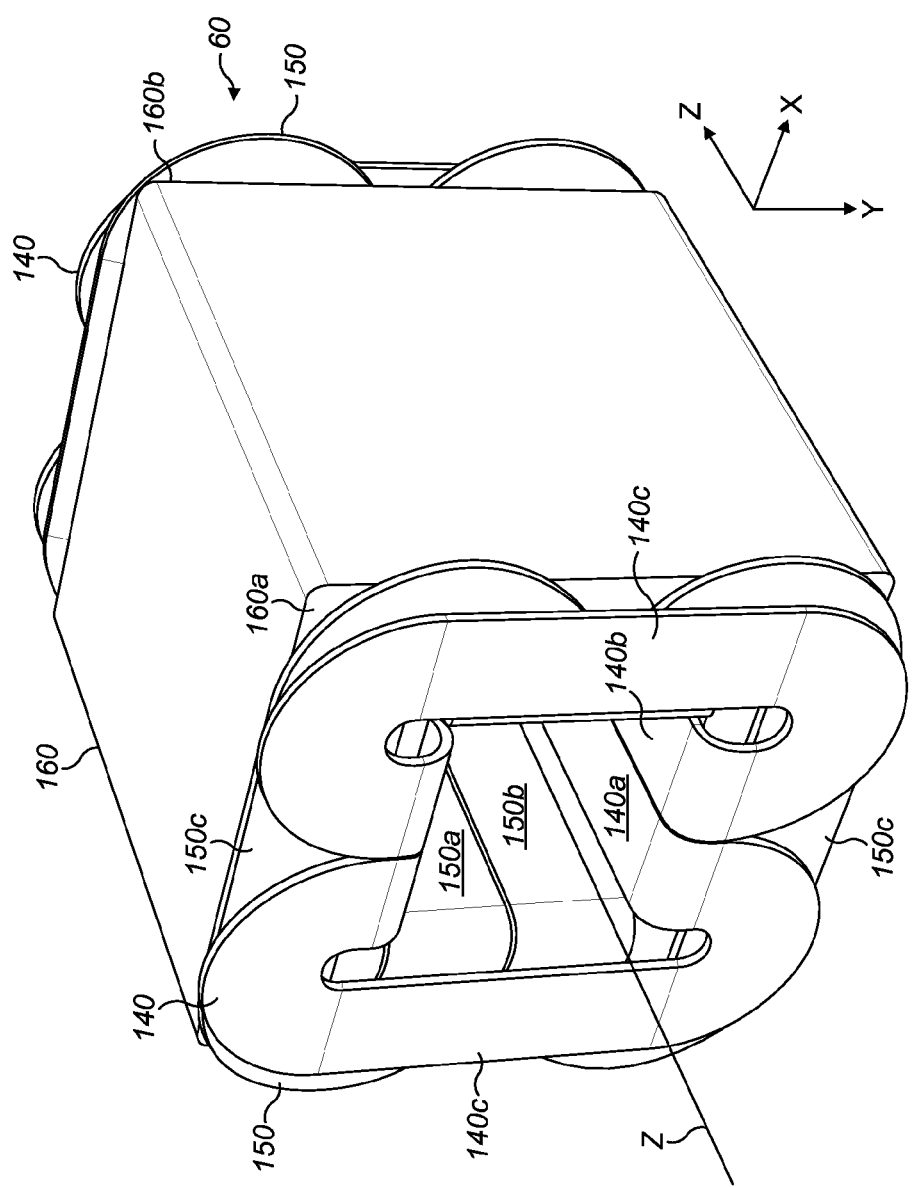
FIG. 2a shows in perspective view an embodiment of the magnetic scanner of FIGS. 1a and 1b, including a magnetic core having ac and dc coil windings thereupon.

In the orientation shown in FIG. 2a, the dc coil windings 150 extend in parallel Y-Z planes equidistantly spaced from the central longitudinal axis Z. The specific embodiment of FIG. 3a shows a square section channel in the magnetic core 60 but it will be understood that such symmetry is not necessary for the successful operation of the magnetic scanner 60 embodying the invention.

Figure 2B:
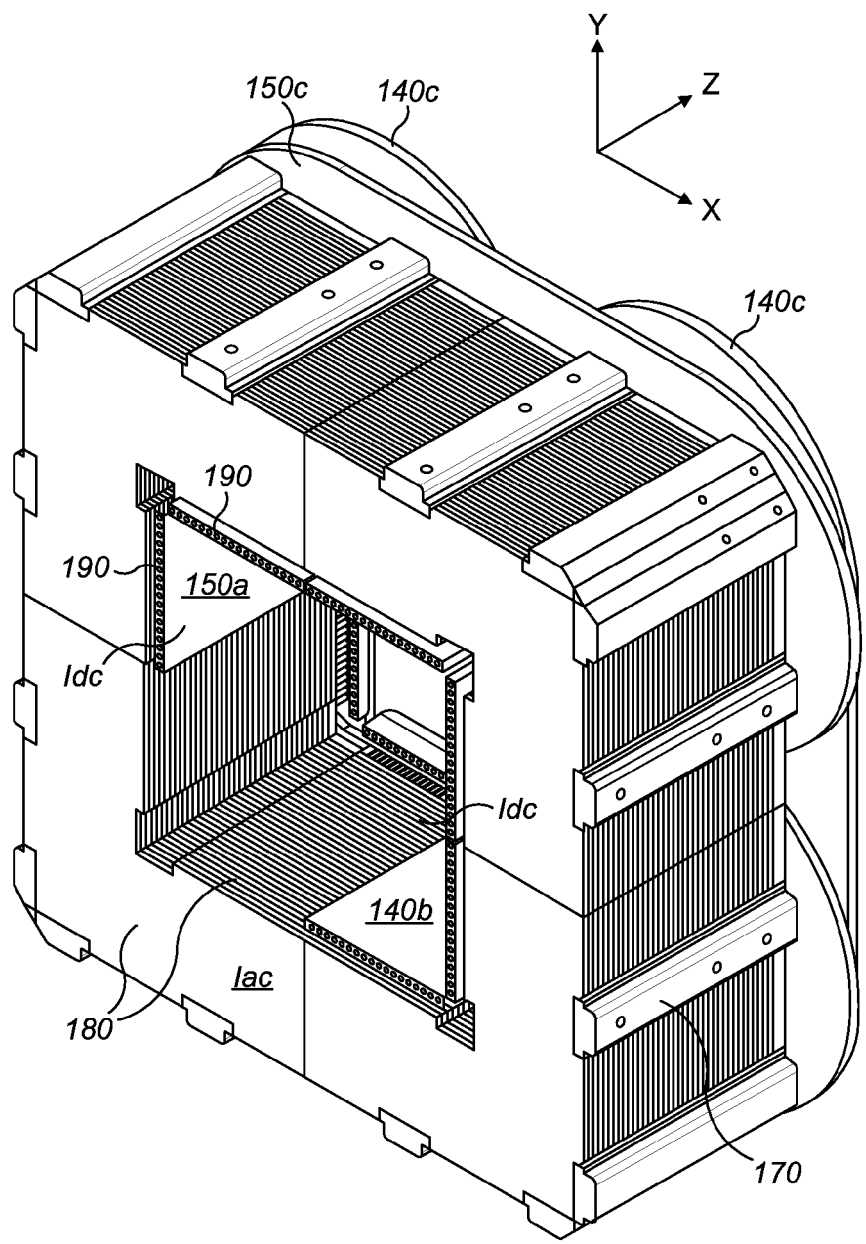

The ac coil windings 140 extend only in the X-Z planes whilst within the length of the rectangular section channel in the magnetic core. Only once the windings are outside the rectangular section channel do they move out of the X-Z plane and into the X-Y plane defined by the first and second faces 160a, 160b of the magnetic core. As is best seen in FIG. 2a, the ac coil windings then turn up the faces 160a, 160b and run adjacent to and on either side of the opening of the rectangular section channel, in a direction parallel with the Y axis. For ease of reference, the section of the ac coil windings 140 that extends along the faces 160a, 160b of the magnetic core has been labeled with reference numeral 140c, whereas the sections that run through the rectangular section channel in the magnetic core have been labeled 140a, 140b. It is to be understood of course that the ac coil windings 140 form a continuous electrical loop around and through the magnetic core. FIGS. 2a and 2b show two identical coil structures defining the windings 140 and these two structures are symmetrically arranged about the Y=0, Z-X plane. They are electrically connected externally so that the currents in both coils are in the same direction for each inner wall inside the channel of the magnetic core. The coil structures each have one layer of windings. There are a variety of other structures that can be practically implemented. For example, if more turns were required to lower the required ac coil current, to achieve a desired ac magnetic field strength, two or more layers of windings may be used.

The dc coil windings 150 likewise extend only in the Y-Z planes whilst within the length of the rectangular section channel in the magnetic core. Only once the windings are outside the rectangular section channel do they move out of the Y-Z plane and into the X-Y plane defined by the faces 160a, 160b of the magnetic core. The dc coil windings 150 then turn up the front faces 160a, 160b and run adjacent to and on either side of the opening of the rectangular section channel, in a direction parallel with the X axis. For ease of reference, the section of the dc coil windings 150 that extends along the faces 160a, 160b of the magnetic core has been labeled with reference numeral 150c, whereas the sections that run through the rectangular section channel in the magnetic core have been labeled 150a, 150b. The dc coil windings, like the ac coil windings, form a continuous electrical loop and can be arranged with similar structural characteristics to the ac coils 140.

The ac and dc coil windings 140, 150 each comprise electrically insulated electrical conductors wrapped around the magnetic core 160. By insulating the ac and dc coil windings 140, 150 from each other, they can be overlaid on top of each other on the 160a, 160b and energized separately. Moreover, the specific mutually orthogonal geometry of the ac and dc coil windings within the rectangular section channel in the magnetic core 160 means that there is no significant inductive coupling between the two, which greatly simplifies the ac and dc power supply operation, in the sense that these power supplies can be operated entirely independently of each other.

When operating with electric current, the coils generate heat because of their electrical resistance and consequent ohmic losses. This can be avoided by using current carrying windings that are made of a superconductive material but these have the complexity of having to be maintained at a very low temperature during operation. In general, at this time, it is more practical and less expensive to use resistive coils. A common choice for the winding material is high purity copper which is practical to use and is of relatively low electrical resistance. In the case of resistive coils, the heat generated is typically removed by liquid cooling with water or water/glycol combinations. Water—or, more generally, liquid—passages must therefore be implemented in the coil structure. For a scanner coil this is conveniently implemented by direct cooling, wherein the winding itself is copper with a hole or holes within the copper through which the water can be passed. This type of cooling arrangement can be discerned in FIG. 2b. An alternative is to use indirect cooling, which consists of contained water channels electrically isolated from, but in good thermal contact with, the windings.

A more detailed view of the construction of a magnetic scanner 60 in accordance with a preferred embodiment of the invention is shown in FIG. 2b. FIG. 2b shows a perspective sectional view (through the X-Y plane) of the magnetic scanner 60 of FIG. 2a. The yoke or magnetic core 160 is in preference formed of a plurality of thin (typically less than 1 mm) laminar ferromagnetic sheets 180, each of which is bonded to an adjacent sheet but separated from it by insulating material. Ribs 170, formed of a generally non-ferromagnetic material such as stainless steel, are welded to the periphery of the laminations—i.e. around the circumference of the magnetic core—in order to secure the laminations together and to provide a means for mounting the resultant magnetic scanner 60 within the ion implanter. Thin ferromagnetic laminations with a low electrical resistance, such as transformer type silicon alloy steel, reduce the heat generated in the magnetic core from magnetic field hysteresis and induced eddy current losses. If necessary, such heat can be removed by air or liquid cooling. An alternate material for the magnetic core 160 is a ferrite material but this magnetically saturates at a lower magnetic field and is somewhat more expensive to use in practice. Fe powders might also be employed.

In use, the ac coil windings 140 are energized by a first, ac power supply (not shown). The ac power supply causes an oscillatory magnetic field to be established, which in turn causes the ion beam 30 to scan in the +/−Y direction across the semiconductor wafer. The dc coil windings 150 are also energized by a dc power supply (not shown) so as to establish an orthogonal dc field. The superimposition of a dc field upon the substantially perpendicular ac oscillatory field results in a magnetic field that never has a zero field at any time during the scan cycle. This in turn eliminates the phenomenon of beam size fluctuations during zero field crossing, as explained in the above referenced U.S. Pat. No. 5,481,116.

In U.S. Pat. No. 5,481,116 however—see in particular FIGS. 3, 4 and 5—both the dc and the ac coils are wound in a "racetrack" configuration so that there is a well-defined pole boundary within the working gap. In this case, the dc field is not very uniform and consequently will cause variations in transverse deflection of the ion beam and consequential ion optical deterioration of the beam size at the downstream substrate.

By contrast the present arrangement, as illustrated in FIGS. 2a and 2b, takes care to ensure that the ac and the dc coils have their turns linearly dispersed, on opposing faces of the rectangular working gap defined by the channel in the magnetic core 160. This means that, over the whole length of the working gap that the ions in the ion beam experience, both the ac and the dc fields are highly uniform. This in turn results in very uniform beam spot characteristics downstream, at the semiconductor wafers 100.

The particular benefit of a bipolar scanner arrangement as provided by the arrangement illustrated in FIGS. 2a and 2b is that it requires less than ¼ of the ac reactive power relative to a unipolar scanner providing the same scan range at the semiconductor wafers 100. The ac power source is a very significant fraction (approximately 30-35%) of the total ion implanter beam line cost. Using a bipolar scanner means that the scan range can be almost doubled without any increase in cost of the ac power source. This is more than adequate for scanning over a 450 mm diameter semiconductor wafer. In fact, the excess power available can also be utilized to provide a larger working gap and/or higher scan frequency, both useful for maximizing the overall commercial performance of an ion implanter.

Figure 8A:
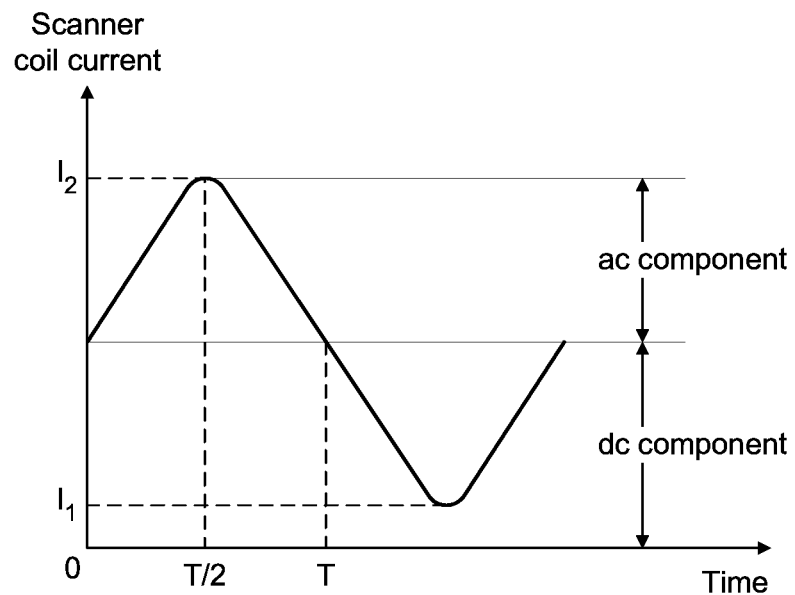
FIG. 8a shows a schematic plot of the ac and dc current components in a unipolar magnetic scanner.

The physical reason for bipolar operation requiring less ac reactive power than unipolar scanning is a consequence of the approximately triangular electric current waveform that must be applied to the magnetic scanner to achieve a uniform irradiance of the substrate. FIG. 8a shows, schematically, a plot of the variation in an energizing current versus time through the coil of a unipolar scanner, as described in U.S. Pat. No. 5,438,203. The triangular shape of the waveform is apparent in FIG. 8a. Between the peak coil current of $I_2$ and the minimum coil current $I_1$, the instantaneous current i varies nearly linearly with time t according to $$I(t)=I_1+(I_2-I_1)\cdot(2t/T) \text{(for } 0 \le t \le T/2),$$

where T is the periodic repetition rate or, loosely speaking, the scan period. The ac reactive power required to support this current function is proportional to the square of the rms current, i.e. $I^2_{rms}$, where:

$$I^2_{rms}(\text{unipolar})=(2/T)\int_0^{T/2}\{I_1+(I_2-I_1)\cdot(2t/T)\}^2 dt=(I^2_1+I_1\cdot I_2+I^2_2)/3$$

For unipolar scanning, in order to avoid zero magnetic field crossing, the minimum current $I_1$ is typically set to approximately 10% of the peak current $I_2$, i.e.

$$I_1 \approx 0.1 I_2$$

In this case:

$$I^2_{rms}(\text{unipolar}) \approx 0.370 I^2_2$$

Figure 8B:
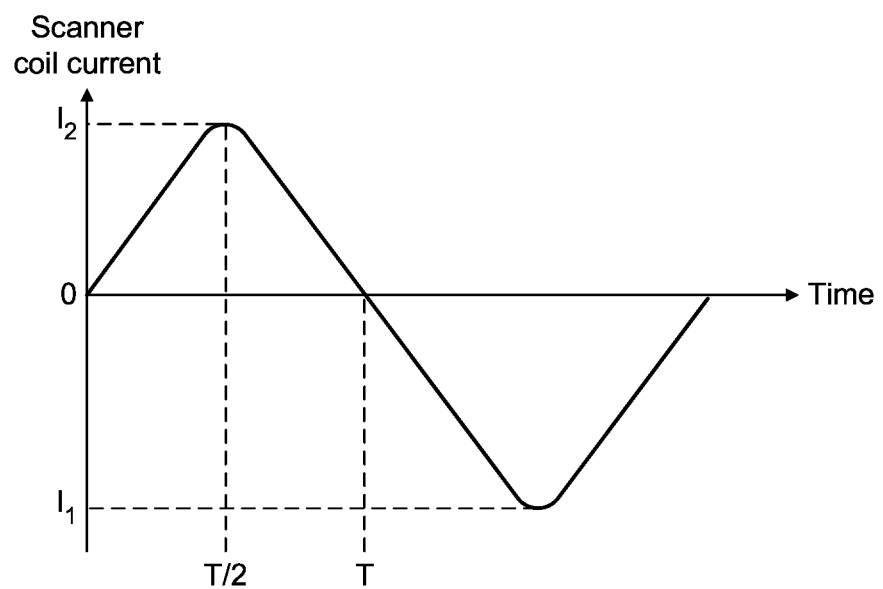
FIG. 8b shows a schematic plot of the ac currents in the coils of the bipolar magnetic scanner of FIGS. 1a, 1b, 2a and 2b, as a function of time.
Figure 9:
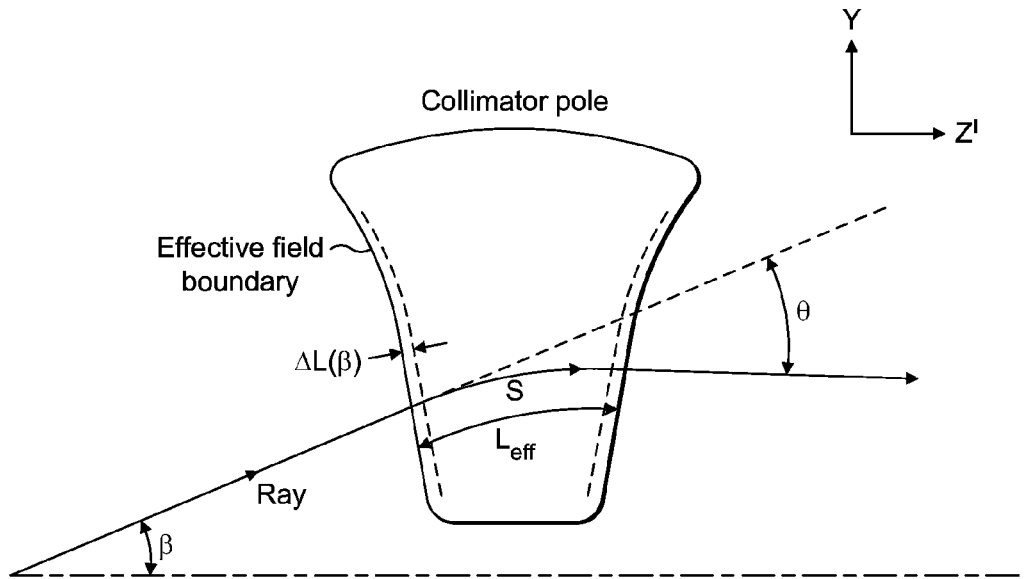
FIG. 9 shows a section through one of the poles of the collimator of FIGS. 5a and 5b in a Y-Z plane, illustrating the effect of pole shape on the ion deflection.
Figure 10:
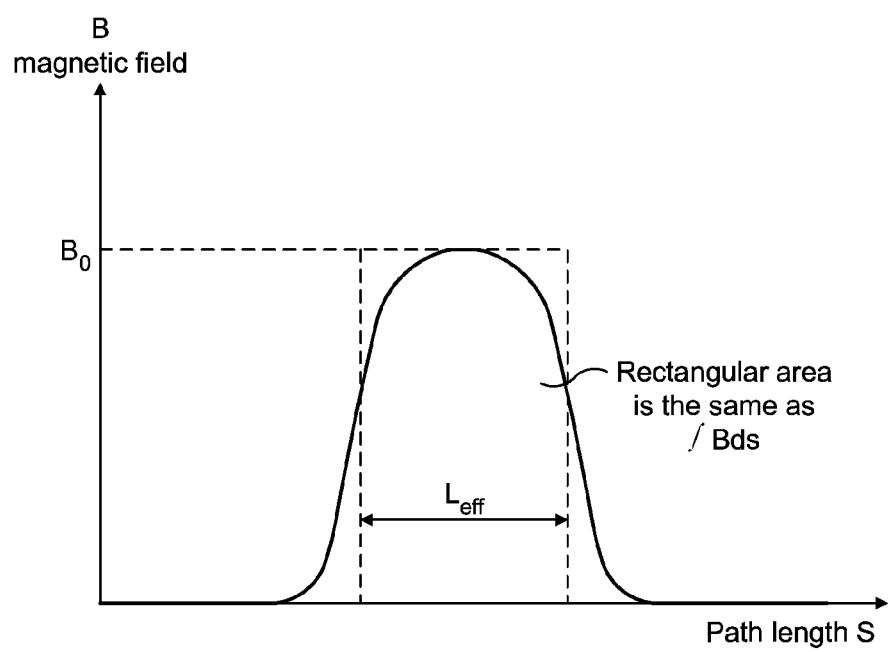
FIG. 10 shows a plot of magnetic flux density B as a function of path length s through the poles of the collimator of FIGS. 5a and 5b.

For bipolar operation, as shown in FIG. 8b, the same scan angle range is achieved with a peak current of just $(I_2-I_1)/2$ in which case the required reactive power is $$I^2_{rms}(\text{bipolar})=(4/T)\int_0^{T/4}\{[(I_2-I_1)/2]\cdot(4t/T)\}^2 dt=(I^2_1-2I_1\cdot I_2+I^2_2)/12$$

This is more than a factor of 4 less than the unipolar rms power. Specifically, for $I_1 \approx 0.1 I_2$:

$$I^2_{rms}(\text{bipolar}) \approx 0.068 I^2_2$$

In addition to the power savings and prevention of beam fluctuations due to zero field crossing, another advantage of a bipolar scanner with the addition of dc coils is that it permits a 10-15 degree bend in the ion beam (in the X-Z plane) to be achieved. This is best seen in FIG. 1a. The bending of the ion beam serves two purposes. Firstly, it prevents neutral particles and half energy particles from impinging upon the substrate, since such particles are not bent enough/at all to continue along the beam line. The other benefit is that the scanner magnet 60 can provide additional specific ion isolation in that, if the bending angle is sufficient, species that are not desired will be removed from the beam ultimately reaching the substrate.

In the scanner shown in FIGS. 2a and 2b, the dc deflection angle is approximately 57% of the peak ac deflection angle for similar, cooling requirements and total coil turns. Operating the dc coil coolant at a higher pressure than that for the ac coils can in practice enable approximately the same dc deflection as the peak ac deflection, i.e. about 13 degrees for the rays shown in FIGS. 5a and 5b. This is more than sufficient to eliminate zero field crossing effects as previously discussed.

That said, there are further advantages to increasing the scanner deflection angle still further, by using multiple layers of dc coil windings dispersed linearly along the lamination surfaces in the Y direction.

Figure 3:
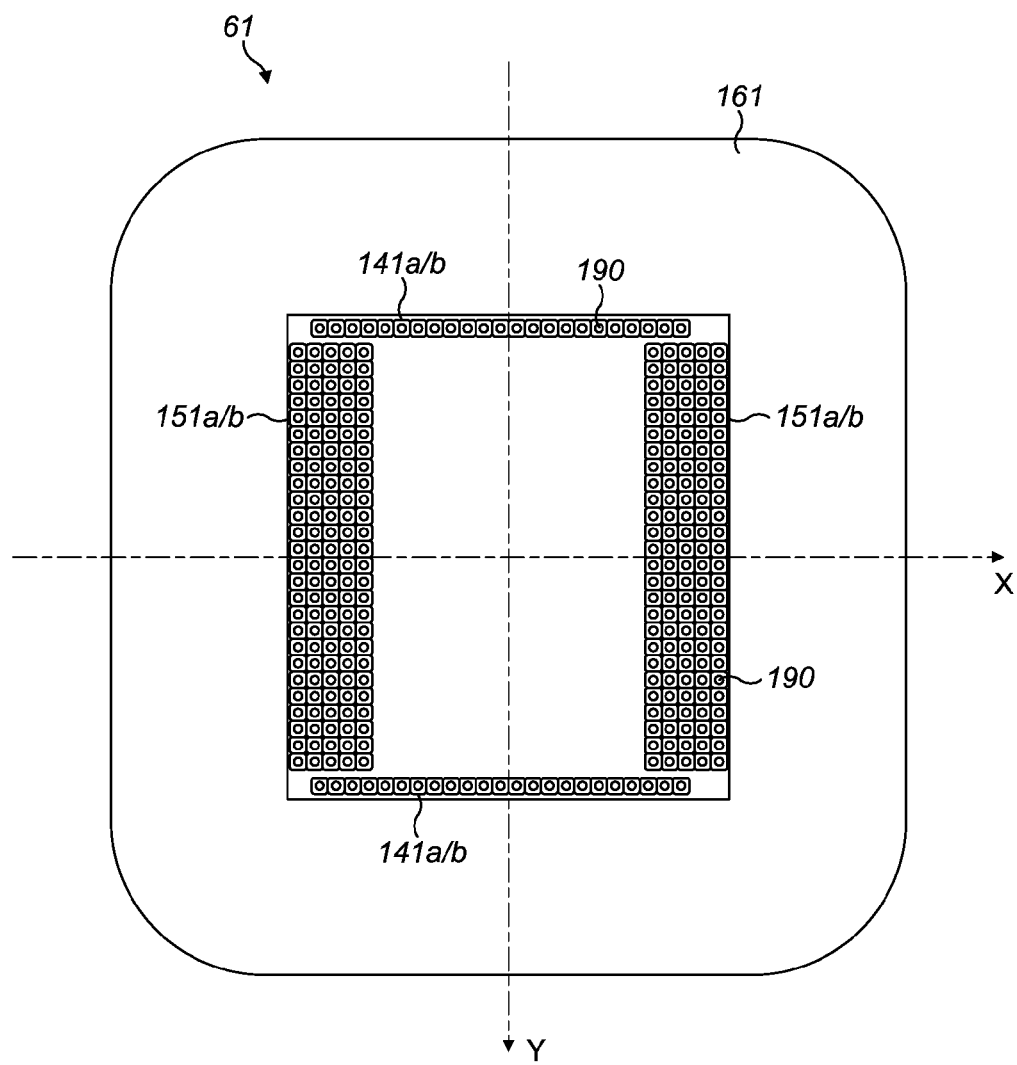
FIG. 3 shows a section in the X-Y plane of a curved magnetic scanner in accordance with another embodiment of the present invention.
Figure 4:
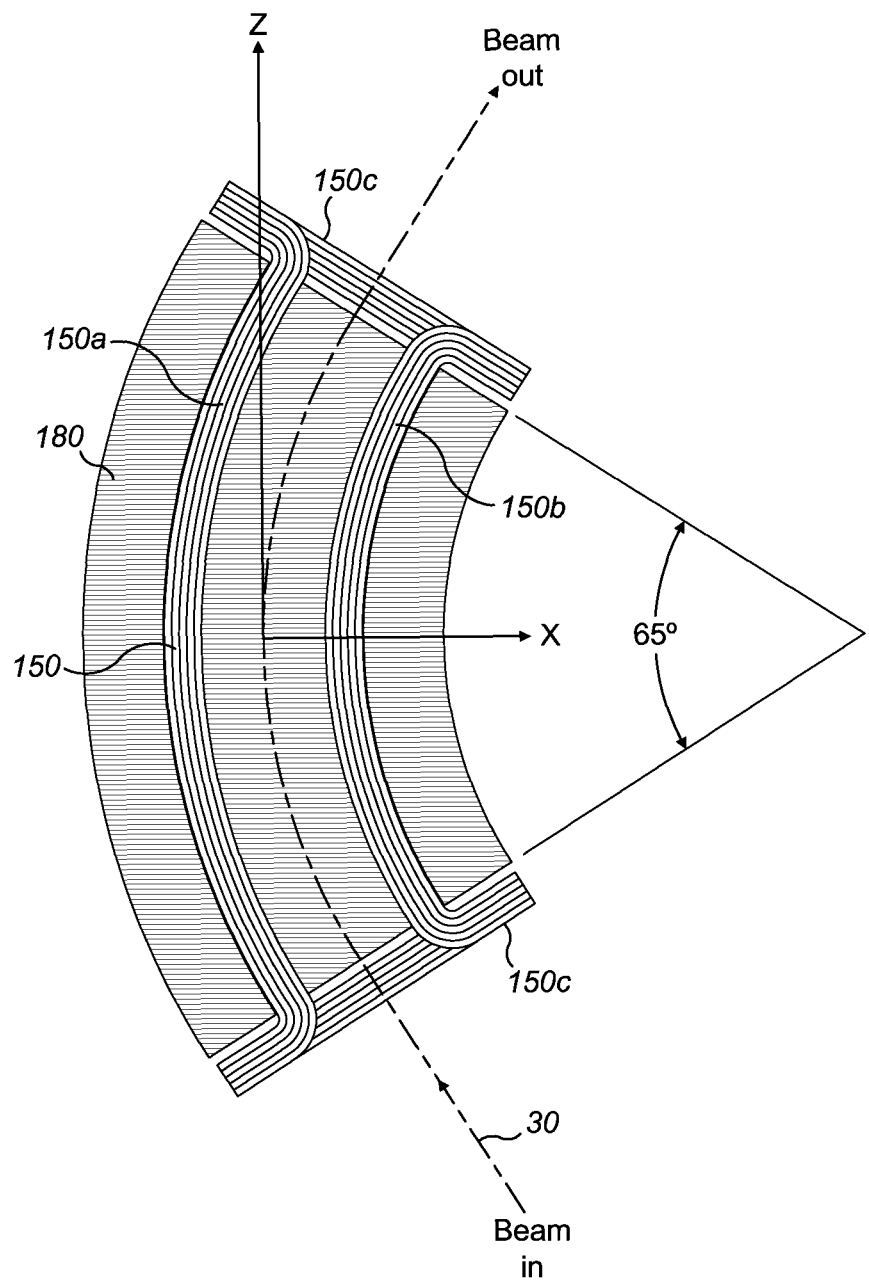
FIG. 4 shows a median section in the X-Z plane of the magnetic scanner of FIG. 3.

FIGS. 3 and 4 suggest an alternative embodiment of a magnetic scanner 61 which permits a much higher bend angle than that of the arrangement of FIGS. 2a and 2b. The magnetic scanner 61 is curved along its length in the X-Z plane to accommodate a bend of (in the embodiment shown in FIG. 4) 65 degrees. As may be seen in FIG. 3, the magnetic scanner 61 is square or rectangular in section with ac and dc coil windings 141a/b, 151a/b extending along opposed and mutually orthogonal internal walls of a laminated magnetic core 161. As with the embodiment of FIG. 2a/2b, the ac and dc coil windings may be cooled in a similar way.

As may be seen in FIG. 3, the dc coil windings might comprise 5 layers. This can increase the bend angle up to 65 degrees (5×13 degrees). For this situation, it is best to curve the magnet aperture as shown in FIG. 4 in order to minimize the aperture width in the X direction. In turn, this minimizes the magnet self-inductance and the ac power supply voltage required.

One advantage of a larger dc deflection angle in the scanner magnet is that this generates significant focusing in the X direction of the beam, eliminating the need for a separate compensator 75 with focusing in the X direction prior to the collimator 80.

A second advantage is that a large deflection angle can provide sufficient momentum resolution to eliminate unwanted particle species in the ion beam arising from either an ion source or a post accelerator. In turn, this can eliminate the need for a separate dc-analyzer magnet normally used to perform such a function which is an important cost saving and physical size consideration.

Turning now to FIGS. 5a, 5b and 6-10, the construction and principles underlying the collimator 80 according to the preferred embodiment of the present invention will now be described. The relative positions and specific shapes of the dipoles 110, 120 that form the collimator 80 may best be seen in FIGS. 5b and 7.

As may be seen in these figures in particular, two opposing dipole magnets 110, 120 each comprise first and second magnetic pole elements 110a, 110b; 120a, 120b. The magnetic pole elements 110a, 110b; 120a, 120b are preferably soft iron magnets excited with coils in order to easily vary the magnetic field amplitude to suit the ion mass, energy and charge.

Figure 6:
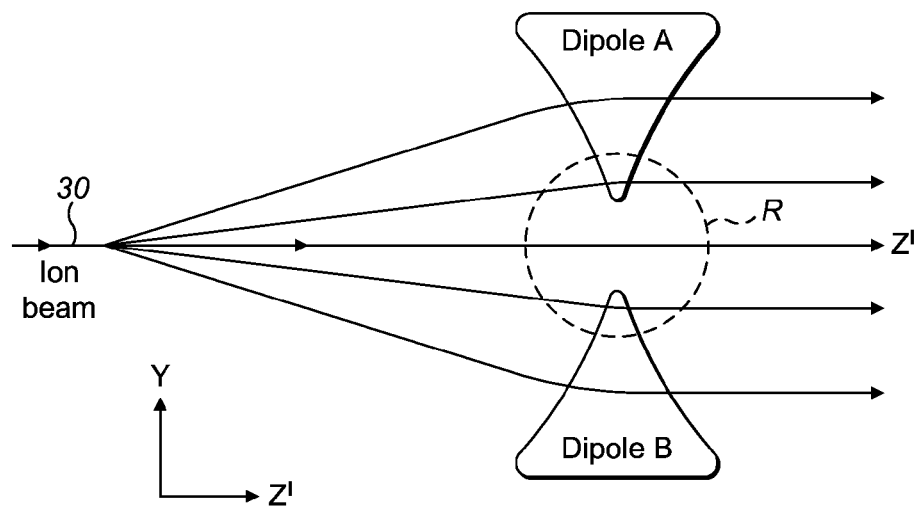
FIG. 6 shows a schematic sectional view, in an X-Z plane, of first and second dipoles of a collimator which is not in accordance with the present invention but which is nevertheless illustrated for a better understanding thereof.

The magnetic pole elements are symmetrically arranged about a central longitudinal axis Z' corresponding to the central axis of the ion beam in the Y=0, Z-X plane after it has emerged from the magnetic scanner (60 or 61) as illustrated in the figures. As may best be seen in FIG. 7, the pole faces C of the dipoles 110, 120 are curved in the X'-Y plane so that the transverse working gap in the X' direction between the magnetic pole elements 110a and 110b of the first dipole and the magnetic pole elements 120a, 120b of the second dipole 120, is narrower towards the extremities of the magnetic pole elements in the Y direction, away from the central longitudinal axis Z'. The gap X' direction between the pole faces becomes larger towards the central longitudinal axis Z'. The reason for this is as follows. If the first and second dipoles 110, 120 were to have a constant transverse working gap to accommodate the width of a ribbon beam 131 as it passes through the collimator 80, then in order to collimate the larger scan angles, the ion path length through the dipoles 110, 120 would need to increase more or less in proportion to the distance from the central longitudinal axis Z', that is, the straight through beam direction. This would, however, lead to a butterfly-type pole shape which is illustrated in FIG. 6. The problem with such twin opposed dipoles is that the poles necessarily become point-like near the central longitudinal axis Z', in the region marked A in FIG. 6. This in turn causes the deflecting magnetic field of the resultant device to become very indeterminate, and even variable with the magnitude of magnet excitation. The consequence is that significant irradiance non-uniformities can arise near the center of the scan region at the semiconductor wafer 100.

In order to avoid this problem, the magnetic pole elements 110a, 110b; 120a, 20b of the collimator 80, in accordance with the embodiments of the present invention, are shaped so as to produce a substantially pure quadrupole magnetic field in the central region A surrounding the central longitudinal axis Z' (see FIG. 7 again). This is achieved by using a substantially hyperbolic contour to the pole surfaces C. Because the aperture becomes larger, and the deflecting field strength weaker near the central longitudinal axis Z', the path length of the beam through the magnetic structure becomes relatively longer in this region and the adjacent point-like pole tips are avoided. The butterfly-like pole shape shown in FIG. 6 becomes far less pronounced. The precise contour of the poles in the Y-X' plane is adjusted to ensure the beam is accurately collimated at large scan angles. A methodology for determining the required pole edge contour is set out below.

Figure 5B:
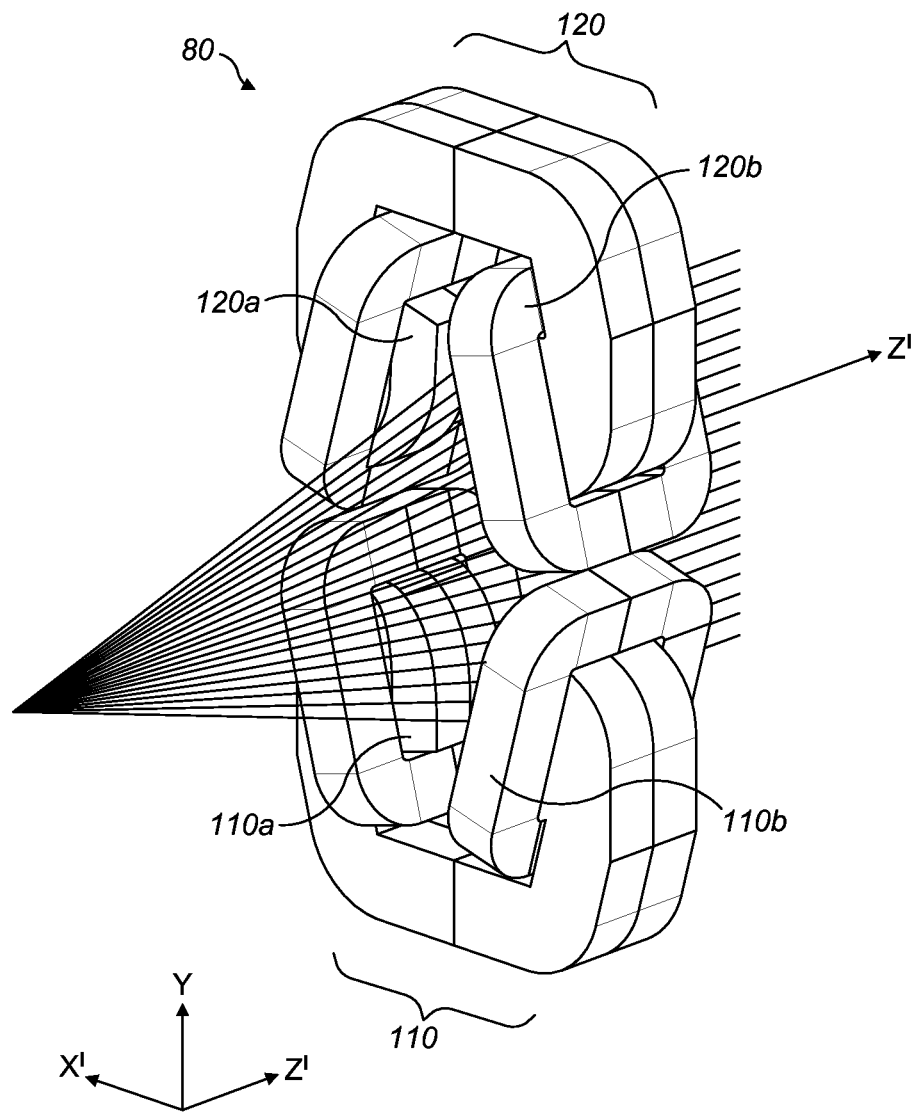
Figure 7:
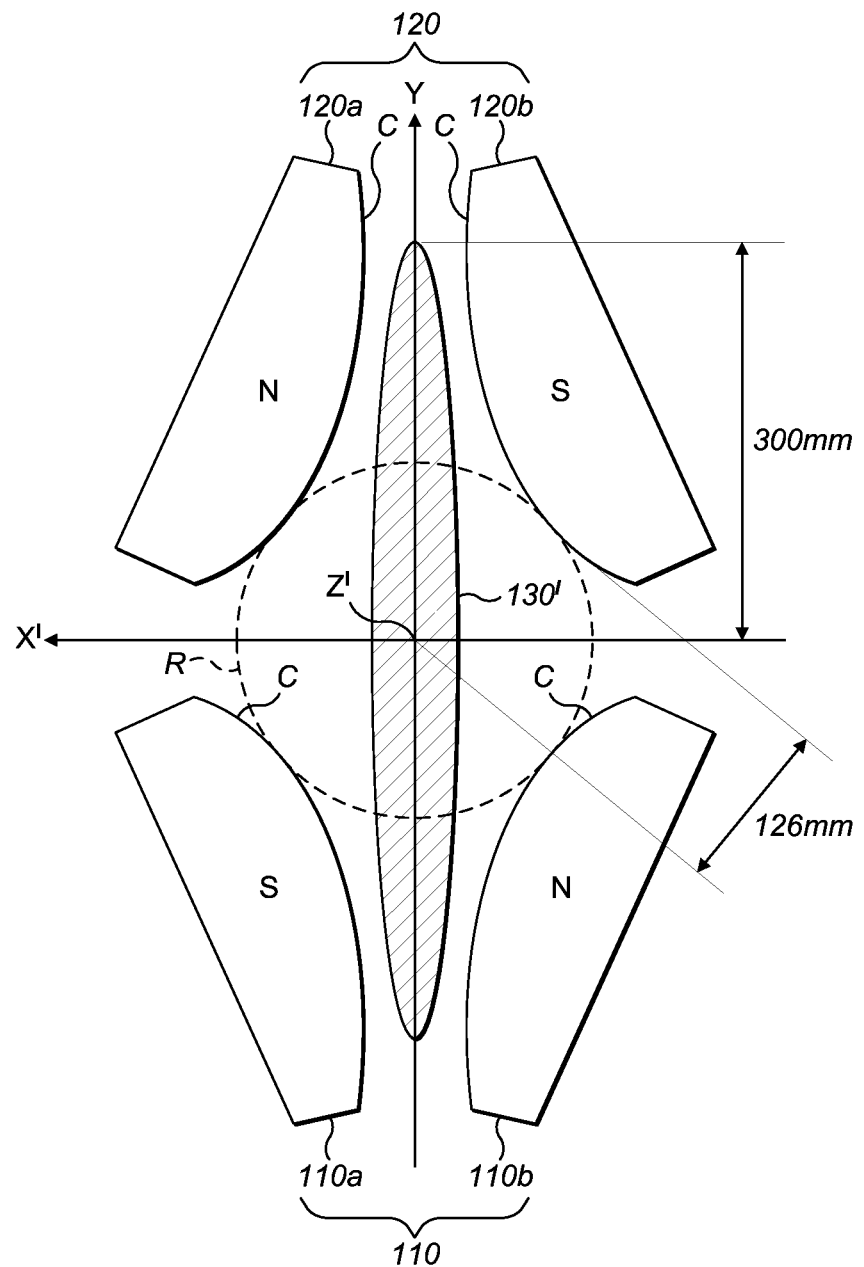
FIG. 7 shows a section through the collimator of FIGS. 5a and 5b, in a X-Y plane parallel with the scanning direction of the ions.

In the specific arrangement shown in FIGS. 5a, 5b and 7, the beam scan height in the Y direction is 600 mm, with symmetrical positioning around the central longitudinal axis Z'. On the other hand, the pole tip aperture diameter (that is, the diameter of the central region R in FIG. 7) is only 252 mm (the radius of 126 mm is indicated in FIG. 7). Occupancy of the beam in the scanning direction is over 200% greater than the aperture defining the central quadrupole field. In a pure conventional symmetrical quadrupole magnet, avoiding ion optical aberrations generally means that less than 70-80% of the pole tip aperture can be occupied by the beam. The reason why the arrangement described herein can use much more of the aperture in the scan direction is because the pole edge contours are shaped to correct ion optical aberrations at large scan angles.

The required pole edge contour may be determined iteratively, either using theoretical calculations, or experimentally measured magnetic fields. To begin with, a best guess of the pole edge contour is used. The fields are calculated or measured for this contour and values of the collimated deflection θ angle as a function of scanner magnet deflection angle β are determined. The angle θ is proportional to the integrated field ∫B ds through the collimator 80. This field integral can be approximated by $$\int B\,ds \approx B_0 L_{\it eff}(\beta)$$

where $B_0$ is the peak field in the collimator and $L_{\it eff}$ is the effective length of the field in the collimator from the entrance field boundary to the exit field boundary. This is illustrated graphically in FIGS. 9 and 10. At each scan angle β, the pole edges are then adjusted to change the effective length by ΔL(β) such that:

$$\Delta L(\beta)/L_{\it eff}(\beta) = (\beta-\theta)/\beta$$

Generally, one or two iterations are all that is necessary to achieve a collimation precision of +/−0.25°. Either the entrance, exit or both pole edges can be adjusted to produce the same total ΔL(β).

Figure 5C:
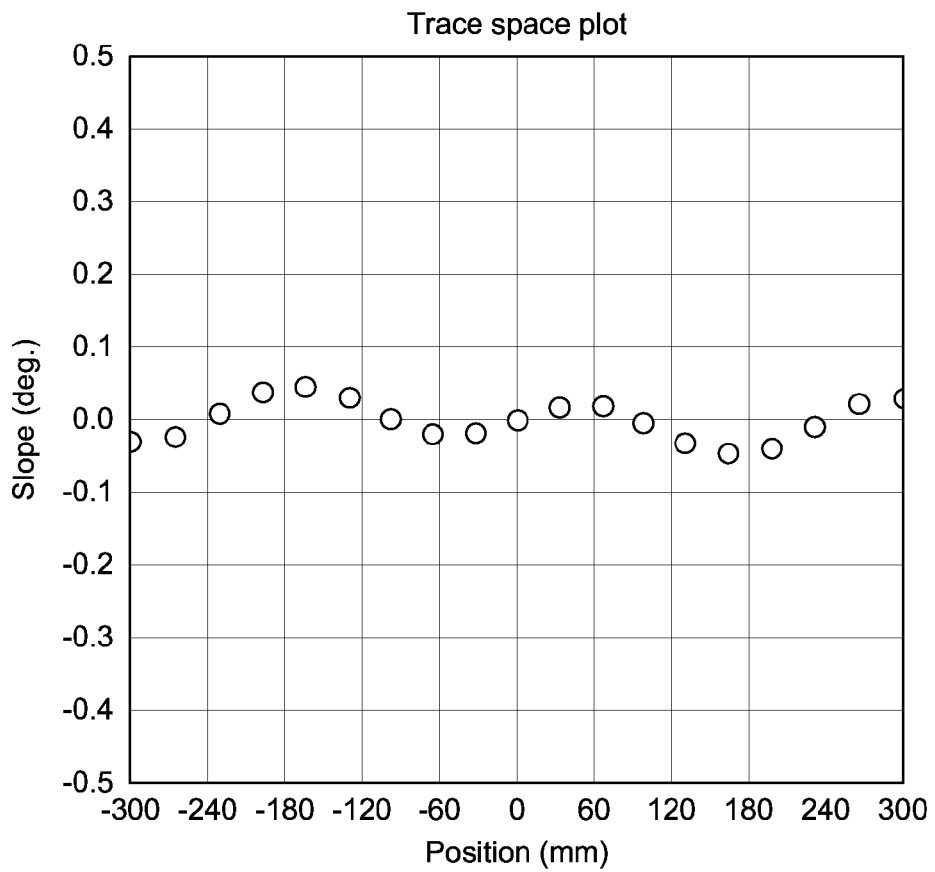
FIG. 5c shows a plot of angular deviation from parallelism of the scanned ion beam, as a function of position across the ion beam.

FIG. 5c shows a plot of angular deviation from parallelism is less than +/−0.05° for each of the rays, as a consequence of the pole profiling and shaping.

Although the foregoing description of the collimator 80 proposes a substantially quadrupolar shape to the magnetic pole elements 110a, 110b; 120a, 120b, it is to be understood that this is merely one of a range of suitable shapes. All that is necessary is that the poles have a monotonic, polynomial, symmetrical shape with a pole gap that increases towards the central longitudinal axis Z'.

It will also be seen in FIG. 5a but best in FIG. 7 that the pole ends may be truncated in the X' direction outside the region of the ion beam. This results in a reduction in overall mass and power requirement.

By providing a symmetric dipole arrangement with a monotonic, polynomial pole shape, the ions may be scanned in both the +Y and −Y directions. That is to say, as seen in FIGS. 5a and 5b, ions having a positive displacement in the +Y direction relative to the central longitudinal axis Z' are deflected in a negative Y direction back towards an axis parallel with the central longitudinal axis Z', whereas ions having a negative displacement in the −Y direction relative to the central longitudinal axis Z' are deflected in the opposite direction (+Y) back towards an axis parallel with the central longitudinal axis Z'. This contrasts with the above referenced U.S. Pat. No. 5,438,203, which deflects all of the ions in the same direction.

As discussed in connection with FIG. 1a, the ion implanter 10 may optionally include a compensator 75 positioned in the beam line upstream of the collimator 80. In a simplest form, the compensator 75 may be a quadrupole, which is energized with a polarity opposite to that of the collimator 80, in order that the compensator 75 might achieve focusing in the X direction. Such focusing in the X direction can compensate for the defocusing in the X direction that is produced by the collimator 80.

The structure of a compensator may also be provided by a smaller version of the collimator 80 structure shown in FIGS. 5a and 5b. Such an arrangement of collimator 80 and smaller but similarly formed compensator 75 is shown in FIGS. 11a, 11b and 11c.

Figure 11A:
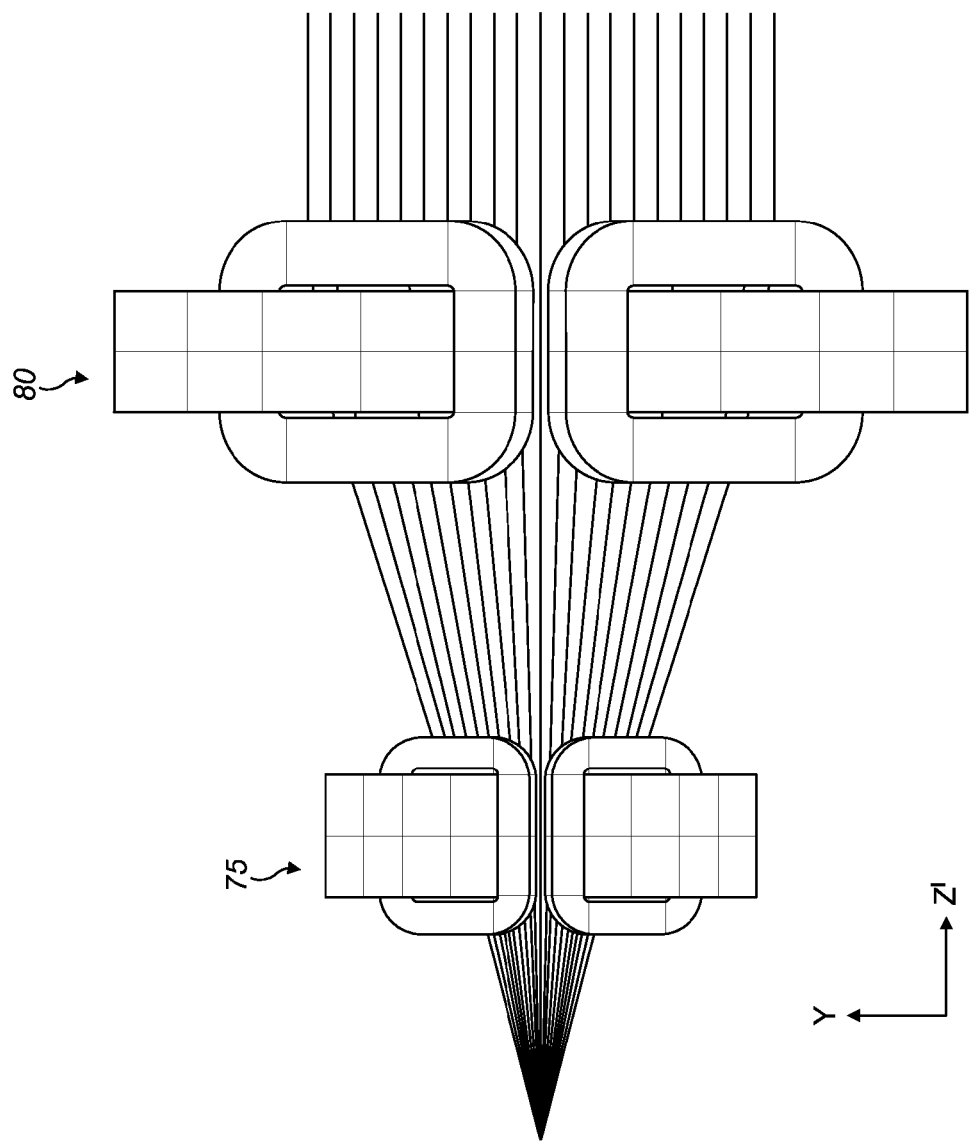
FIGS. 11a, 11b and 11c show, respectively, plan views in the Y-Z and X-Z planes and a perspective view, of a compensator device upstream of the collimator of FIGS. 5a and 5b.
Figure 11B:
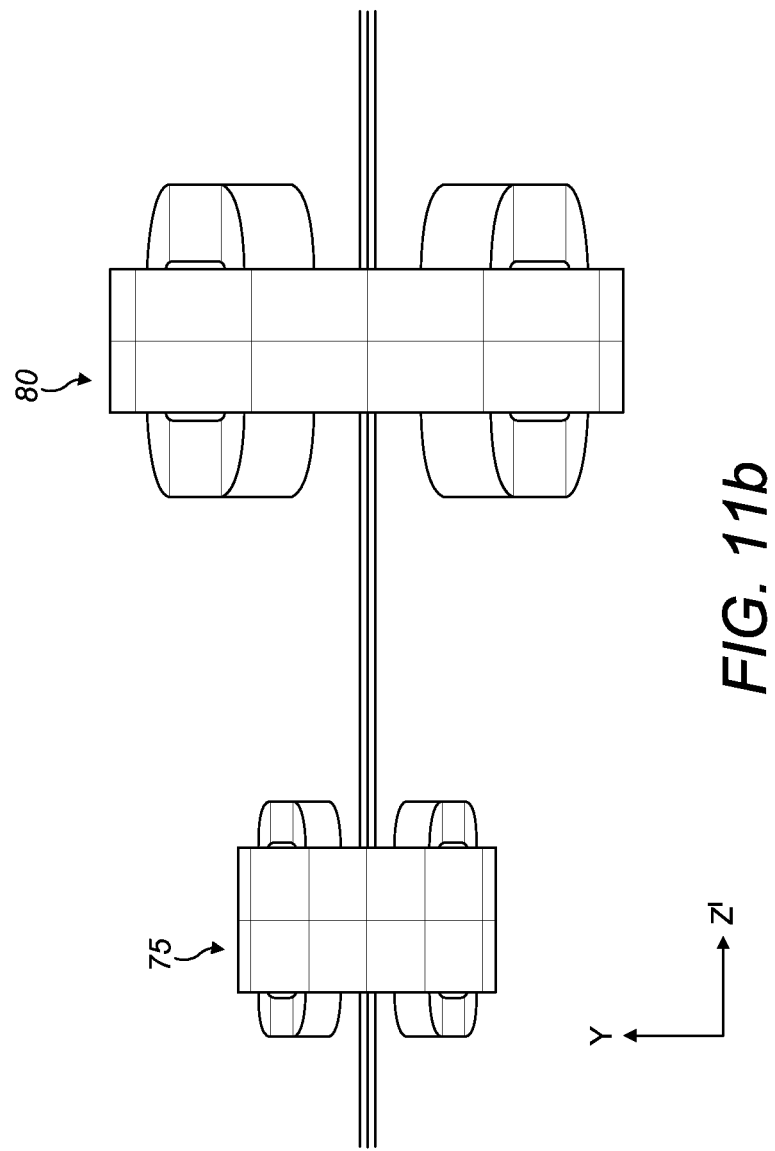
Figure 11C:
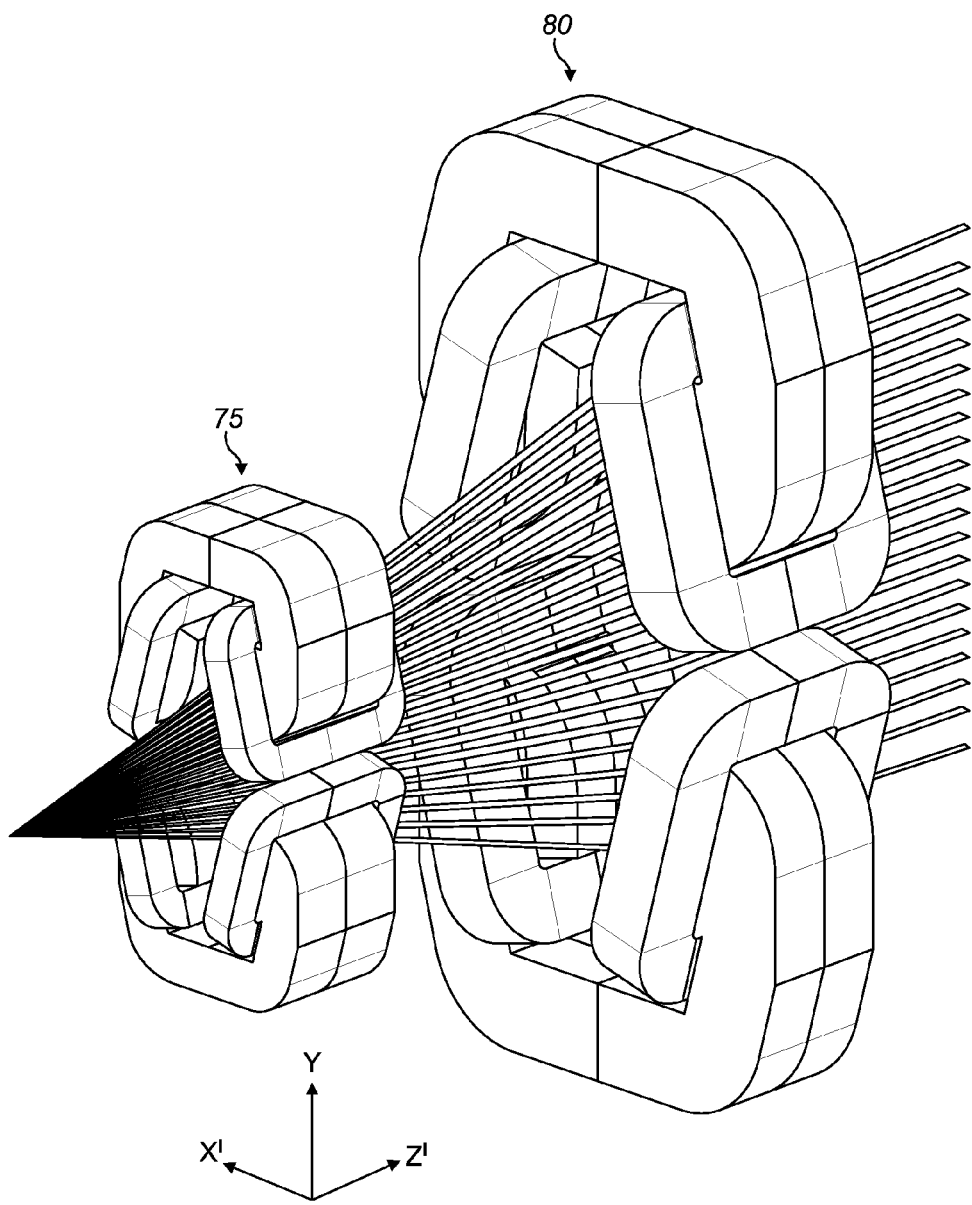

Moreover, although in FIGS. 11a, 11b and 11c, a separate (optional) compensator is proposed, the ion beam shape compensation function provided by the compensator 75 can instead be provided as an integral part of the curved magnetic scanner 61.

The combination of a bipolar collimator used in conjunction with a bipolar scanner as described in the embodiments of the present invention enables an ion implanter to have the features of precise uniform ion beam irradiance of a substrate with a minimum commercial cost. This arises from a structure and method of avoiding zero field crossing in the magnetic scanner and a structure and method in the collimator of avoiding central fluctuations in beam irradiance at small ion beam scan angles.

The foregoing detailed description has described only a few of the many forms that this invention may take. For this reason the detailed description is intended by way of illustration and not by way of limitation. It is only the following claims, including all equivalents, which are intended to define the scope of the invention.

The invention claimed is:

1. A magnetic deflection system for scanning an ion beam over a selected surface, comprising:
a magnetic core having first and second core end faces and a channel extending through the magnetic core between the first and second core end faces;
ac coils having ac coil windings extending through the channel in the magnetic core;
dc coils having dc coil windings also extending through the channel in the magnetic core, said dc coils being substantially free from inductive coupling with said ac coils;
the ac coils and dc coils defining therebetween a gap through which the ion beam passes;
an ac current source, coupled to said ac coils and adapted to apply to said ac coils an excitation current to generate an ac magnetic field in said gap that substantially alternates in polarity as a function of time, to cause scanning of the ion beam; and
a dc current source coupled to said dc coils, and adapted to apply to said dc coils a current that generates the dc magnetic field in the gap;
wherein the ac coil windings extend in a longitudinal direction of the channel across the first and second core end faces, and are substantially unidirectional between the first and second core end faces, and further wherein the dc coil windings extend in a longitudinal direction of the channel across the first and second core end faces, and are substantially unidirectional between the first and second core end faces.

2. The magnetic deflection system of claim 1, wherein the ac coil windings extend in first and second planes parallel with the longitudinal direction of the channel, wherein the dc coil windings extend in third and fourth planes also parallel with the longitudinal direction of the channel, and further wherein the first and second planes lie perpendicular to the third and fourth planes such that the scanning and dc coil windings define between them an enclosed space forming the said gap.

3. The magnetic deflection system of claim 1, wherein a first set of the ac coil windings extend in a first group along the said longitudinal direction of the channel, and a second set of the ac coil windings extend in a second group along the said longitudinal direction of the channel, the first and second groups being arranged in parallel and adjacent one another as they extend through the channel between the first and second end faces, but wherein the first and second sets of ac coil windings are arranged so as to diverge from one another outside of the said channel as they extend across the first and second end faces.

4. The magnetic system of claim 3, wherein a first set of the dc coil windings extend in a first group along the said longitudinal direction of the channel, and a second set of the dc coil windings extend in a second group along the said longitudinal direction of the channel, the first and second groups being arranged in parallel and adjacent one another as they extend through the channel between the first and second end faces, but wherein the first and second sets of dc coil windings are arranged so as to diverge from one another outside of the said channel, and to extend across the first and second end faces.

5. The magnetic deflection system of claim 4, wherein each of the first and second sets of ac coil windings, and each of the first and second sets of dc coil windings, extend across the first and second core end faces of the magnetic core.

6. The magnetic deflection system of claim 5, wherein the first and second sets of ac coil windings are arranged on top of, but are insulated from, the first and second sets of dc coil windings, on the first and second core end faces of the magnetic core.

7. The magnetic deflection system of claim 1, wherein the ac coils include one or more lateral spacings formed between the ac coil windings, for receiving coolant fluid, and further wherein the dc coils include one or more lateral spacings formed between the dc coil windings, for receiving coolant fluid.

8. The magnetic deflection system of claim 1, wherein the channel extending through the magnetic core is curved between the first and second core end faces.

9. The magnetic deflection system of claim 1,
wherein the ac coil windings are each parallel with one another through the channel but are formed outside of the channel in non-parallel directions; and
further wherein the dc coil windings are each parallel with one another through the channel but in a different plane or planes to that or those in which the ac coil windings lie, the dc coil windings being formed outside of the channel in non-parallel directions.

10. The magnetic deflection system of claim 9, wherein the ac and dc coil windings are each formed in non-parallel directions over a part of the first and second core end faces.

11. The magnetic deflection system of claim 1, wherein the ac coil windings extend in a direction generally orthogonal with the direction of the ac magnetic field along substantially the whole of the length of the magnetic core between the first and second core end faces.

12. The magnetic deflection system of claim 11, wherein the dc coil windings extend in a direction substantially orthogonal with the direction of the dc magnetic field along substantially the whole of the length of the magnetic core between the first and second core end faces.

13. An ion implantation system comprising:
an ion source for generating an ion beam including a selected species of ions;
the magnetic deflection system of claim 1, positioned downstream of the said ion source;
an end station arranged to position a semiconductor substrate having a selected surface for receiving said ion beam; and
a vacuum housing extending from said ion source, about or through said magnetic deflection system to said end station, so that said ion beam travels under vacuum from said ion source, via said magnetic deflection system to said end station;
wherein the ac coils, when energized by the ac current source, scan the ion beam in a first direction in the plane of the said selected surface, and further wherein the dc coils, when energized by the dc current source, cause the ion beam to deviate in a plane perpendicular to the first direction in which the ion beam scans.

14. The ion implantation system of claim 13, wherein the magnetic deflection system defines a central longitudinal axis between an entrance and an exit of the said magnetic deflection system, and wherein the dc coils, when energized, cause ions in the ion beam lying to a first side of the central longitudinal axis in the said plane perpendicular to the said first direction, to converge towards, and cross, the said central longitudinal axis, but cause ions in the ion beam lying to a second, opposed side of the central longitudinal axis in the said plane perpendicular to the said first direction, to diverge away from the said central longitudinal axis.

15. The ion implantation system of claim 13, further comprising a secondary ion beam collimator located downstream of the said magnetic deflection system and configured to collimate the scanned ion beam in a direction generally orthogonal both to the direction of travel of the ion beam and also to the direction in which the ion beam is scanned.

16. The ion implantation system of claim 13, further comprising an ion beam collimator having first and second mutually opposed, symmetrical dipoles, defining therebetween an ion beam aperture having a central axis extending through it in a direction parallel with a central ion beam trajectory, each pole of the said first and second dipoles having a pole face varying monotonically and polynomially in a direction perpendicular to the said central axis, so as to form an increasing pole gap towards the said central axis.

17. The ion implantation system of claim 16, wherein each pole face of the ion beam collimator has a generally hyperbolic contour, so as to create a quadrupolar field within the ion beam aperture.

18. The ion implantation system of claim 16, wherein the width of the first and second dipoles of the ion beam collimator, in a direction parallel with the central axis, increases with distance in a direction perpendicular to the said central axis, so that ions arriving at the ion beam collimator at positions relatively distal from the central axis in a direction perpendicular thereto have a longer path length through the ion beam collimator than ions arriving at the collimator at positions relatively close to the central axis in the said perpendicular direction, so that ions arriving at the ion beam collimator in a fan shaped beam are caused to exit the said collimator as a substantially parallel beam with an axis parallel with the central axis of the collimator.

19. The ion implantation system of claim 16, wherein the poles of the collimator are truncated at a position of maximum separation between the pole faces in each of the first and second dipoles, in a direction perpendicular to the said central axis of the ion beam aperture.

20. A method of scanning an ion beam over a selected surface, the method comprising the steps of:
(a) generating ions in an ion source;
(b) generating, in a longitudinal channel of a magnetic scanner positioned downstream of the ion source:
(i) an ac field, and
(ii) a dc field, in a plane substantially orthogonal to that of the ac field;
wherein the magnetic scanner has a magnetic core having first and second core end faces and a channel extending through the magnetic core between the first and second core end faces; ac coils having ac coil windings extending substantially unidirectionally through the channel in the magnetic core and across the first and second core end faces, to generate the ac field; dc coils having dc coil windings also extending substantially unidirectionally through the channel in the magnetic core and across the first and second core end faces to generate the dc field, said dc coils being substantially free from inductive coupling with said ac coils; the ac coils and dc coils defining therebetween the longitudinal channel;
(c) directing the ions from the ion source into the longitudinal channel of the magnetic scanner so that they are caused by the ac field in the channel to scan across the selected surface positioned downstream of the magnetic scanner.

21. A method of generating a parallel beam of ions in an ion implanter, comprising the steps of:
(a) generating ions in an ion source;
(b) deflecting the ion beam path in a magnetic scanner so as to form a generally fan shaped ion beam;
(c) directing the fan shaped ion beam towards an ion beam collimator having an ion beam aperture with a central axis extending through it in a direction parallel with a central ion beam trajectory;
(d) collimating the fan shaped beam of ions in the collimator, such that ions exit the collimator as a parallel beam in a direction generally parallel with the said central axis of the ion beam aperture;
the said step (d) of collimating the fan shaped beam further comprising:
(e) generating a magnetic field in the ion beam aperture of the collimator that varies monotonically and polynomially in a direction perpendicular to the said central axis, so that ions arriving at the collimator relatively close to the said central axis in a direction perpendicular thereto experience a weaker magnetic field strength than those ions relative distal from the said central axis in a direction perpendicular thereto.

* * * * *